(12) United States Patent
Tourette

(10) Patent No.: US 8,121,495 B2
(45) Date of Patent: Feb. 21, 2012

(54) CURRENT MIRROR CIRCUIT AND OPTICAL RECEIVER CIRCUIT USING THE SAME

(75) Inventor: Bruno Tourette, Cupertino, CA (US)

(73) Assignee: Sumitomo Electric Industries, Ltd., Osaka (JP)

( * ) Notice: Subject to any disclaimer, the term of this patent is extended or adjusted under 35 U.S.C. 154(b) by 507 days.

(21) Appl. No.: 12/320,745

(22) Filed: Feb. 3, 2009

(65) Prior Publication Data

US 2009/0202259 A1    Aug. 13, 2009

Related U.S. Application Data

(60) Provisional application No. 61/006,869, filed on Feb. 4, 2008.

(51) Int. Cl.
*H04B 10/06* (2006.01)

(52) U.S. Cl. ........ 398/202; 398/208; 398/209; 398/135; 398/136; 398/164; 250/214 A; 250/214 AG; 250/214 R; 250/214 C; 250/214 LA; 330/59; 330/308

(58) Field of Classification Search .................. 398/202, 398/208, 209, 135, 136, 137, 138, 139, 213, 398/214, 164, 128, 130; 250/214 A, 214 R, 250/214 LA, 214 C, 214 AG; 330/59, 308
See application file for complete search history.

(56) References Cited

U.S. PATENT DOCUMENTS

| | | | |
|---|---|---|---|
| 6,333,804 B1* | 12/2001 | Nishiyama et al. | 398/202 |
| 2003/0178552 A1* | 9/2003 | Hofmeister et al. | 250/214 R |
| 2005/0194955 A1* | 9/2005 | Moran | 323/315 |
| 2005/0224697 A1* | 10/2005 | Nishiyama | 250/214 A |

* cited by examiner

*Primary Examiner* — Hanh Phan
(74) *Attorney, Agent, or Firm* — Smith, Gambrell & Russell, LLP

(57) ABSTRACT

A current mirror circuit and an optical receiver circuit implementing with the current mirror circuit are disclosed. The current mirror circuit provides two MOSFETs and two differential amplifiers. The MOSFETs are operated under the same bias condition even the power supply voltage decreases due to the virtual short-circuit characteristic between two inputs of the differential amplifier. One of the differential amplifiers provides a variable gain and output impedance characteristic to stabilize the feedback loop formed by this differential amplifier and one of the MOSFETs.

13 Claims, 5 Drawing Sheets

Large Optical Input Power
(large photocurrent Ipd)

Small Optical Input Power
(Small Photocurrent)

Small Optical Input Power (Small Photocurrent)

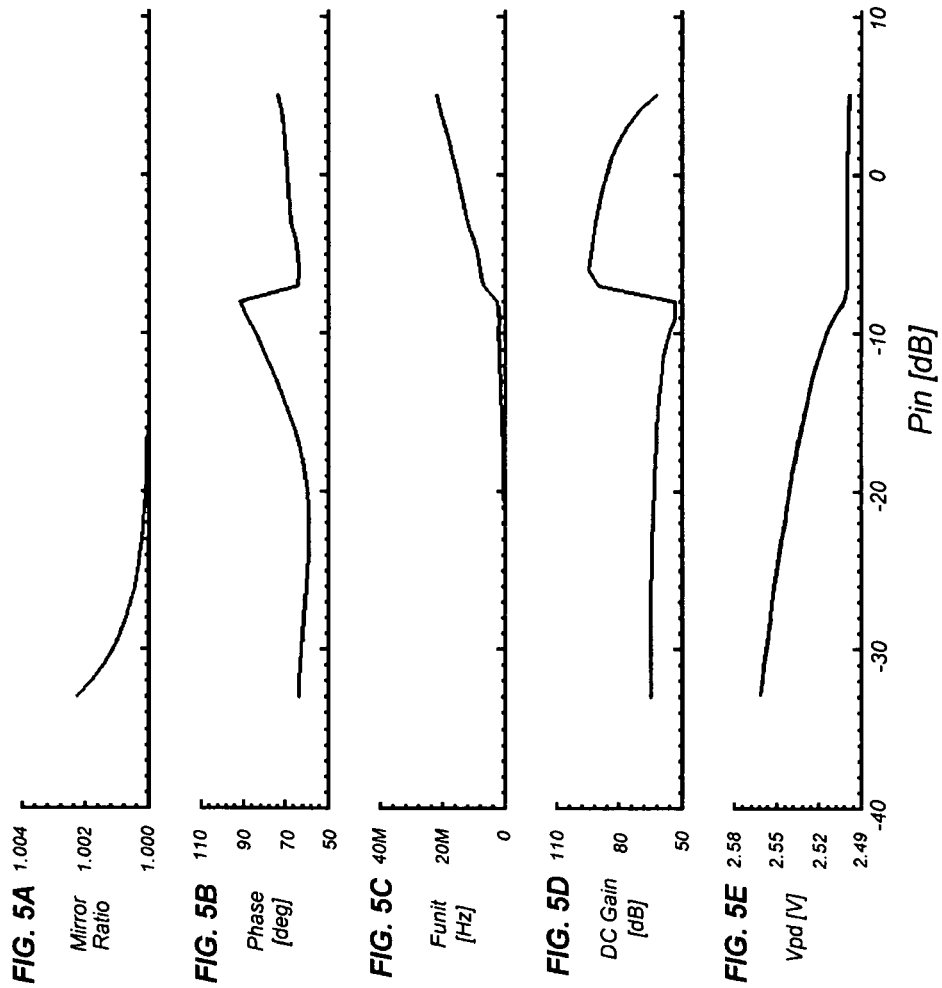

CURRENT MIRROR CIRCUIT AND OPTICAL RECEIVER CIRCUIT USING THE SAME

CROSS-REFERENCE TO RELATED APPLICATION

This application claims the benefit of U.S. Provisional Application No. 61/006,869, entitled "CMOS receive power monitoring circuit for optical receiver", which is hereby incorporated by reference.

BACKGROUND OF THE INVENTION

1. Field of the Invention

The present invention relates to an optical receiver with a current mirror circuit, in particular, the invention relates to an optical receiver with a current mirror circuit implementing with MOSFETs.

2. Description of Prior Arts

An optical receiver that receives an optical signal and converts it to a corresponding electrical signal generally provides a function to monitor an average power of the optical signal. In the optical receiver including a photodiode (hereafter denoted as PD), the circuit detects an average of the photocurrent generated in the PD by inserting a resistor in a bias line to the PD and by detecting a voltage difference in this resistor caused by the photocurrent. However, because the dynamic range of the input optical power varies over 3-digits or more, from a few micro-decibel (dBµ) to a few milli-decibel (dBm) or more, the technique above described to detect the optical power through the voltage difference by the resistor has an inherent subject of the inaccuracy in a case of lower optical powers and the insufficient bias voltage for the PD in case of higher optical powers.

Another method has been known in place of the sensing resistor described above, in which the optical receiver provides a current mirror circuit between the bias power supply and the PD. The current mirror circuit may reflect the photocurrent generated by the PD to a mirror current to be processed by the optical receiver. The current mirror circuit generally provides bipolar transistors operated in the saturation region, where the collector current becomes independent of the collector-emitter bias, to show a fine current-mirror characteristic. However, it is necessary to set the forward bias condition for the p-n junction between the base and the emitter of the bipolar transistor to operate the transistor in the saturation region. This forward bias condition reaches at least 0.6 to 0.7 V, and the PD is biased by a voltage that the forward bias voltage is subtracted from the bias power supply.

On the other hand, recent electronic equipments continuously request the reduction of the power consumption. The optical receiver is not an exception of the request. For instance, the optical receiver installing a PIN-PD had been allowed to implement with a power supply of 5V. However, recent specifications of the optical receiver request the power supply of 3.3 V or less. Under such a circumstance, the forward bias condition of about 0.7 V for the bipolar transistor becomes a weighty factor.

Because the current mirror circuit using bipolar transistors becomes apparent to have inherent subjects described above, in particular, the subject under a lower power supply, the MOSFETs instead of the bipolar transistor has been practical. However, the MOSFETs has a lower voltage gain compared with that of the bipolar transistor and are hard to get a satisfactory current mirror characteristics. The present invention is to provide a current mirror circuit implemented with MOSFETs that shows good mirror performance.

SUMMARY OF THE INVENTION

One aspect of the present invention relates to an optical receiver that comprises a PD, a power supply, a sensing resistor and a current mirror circuit. The current mirror circuit, which is connected between the power supply and the PD, includes a first input terminal, first and second output terminals, and first and second current paths. The first current path is inserted between the first input terminal and the first output terminal, while, the second current path is inserted between the first input terminal and the second output terminal. The first input terminal receivers the power supply, the first output terminal connects the PD thereto, and the second output terminal couples the sensing resistor. The first current path implements with a first transistor to provide the photocurrent in the first output terminal; while, the second current path implements with a second transistor to provide the mirror current that mirrors the photocurrent in the second output terminal. In the present invention, the first transistor and the second transistor are biased in a substantially same condition. That is, both transistors each have two current terminals and one control terminal that controls the current flowing between two current terminals, and, in the present invention, these three terminals of respective transistors are biased substantially in the same condition.

The current mirror circuit of the invention may further provide a third transistor, first and second differential amplifiers, and second input terminal. The second input terminal receives a reference voltage, and the second differential amplifier reflects this reference voltage to the first output terminal by a function of the virtual short circuit between the inverting and the non-inverting inputs of the differential amplifier, while, the first differential amplifier reflects this reference voltage reflected in the first output terminal to the second transistor. The third transistor, which is driven by the first differential amplifier, absorbs the difference between the reference voltage reflected in the second transistor and the voltage drop caused in the sensing resistor by the mirror current. Thus, the first and second transistors are biased substantially in the same condition and the reference voltage may be reflected in the first output terminal independent of the photocurrent flowing in the first transistor, which maintains the bias voltage applied to the PD to be substantially constant.

The second differential amplifier and the first transistor constitute a feedback loop to reflect the reference voltage to the first output terminal. In order to operate the feedback loop stably, the second differential amplifier of the invention provides a function to vary the gain and the output impedance thereof dynamically. The second differential amplifier may reduce the gain and the output impedance only when the photocurrent is relatively small, which shifts the pole frequency formed by the miller capacitor between the output of the second differential amplifier and the first output terminal and the output impedance toward higher frequency. Thus, the loop gain of the feedback loop has a slope of −20 dB/dec at a frequency where the loop gain is 0 dB, which means that the feedback loop may operate stably.

Another aspect of the present invention relates to a current mirror circuit that provides MOSFETs as primarily devices. The current mirror circuit of the invention may have a broad dynamic range for the current to be mirrored, from several micro-amperes (µA) or less to several milli-amperes (mA) or more because the MOSFETs that determine the mirror ratio are biased in a substantially same condition.

The current mirror circuit of the invention may further comprise, in addition to the MOSFETs to determine the mirror ratio, first and second differential amplifiers and a third MOSFET. The MOSFETs to determine the mirror ratio are commonly connected with the power supply and commonly driven by the second differential amplifier. Thus, one of the MOSFETs, the first MOSFET, and the second differential amplifier forms a feedback loop that reflects the reference voltage set in the inverting input of the second differential amplifier to the non-inventing input thereof that is connected to one of the MOSFETs by the function of the virtual short circuit between the inverting and the non-inverting inputs of the differential amplifier. The first differential amplifier drives the third MOSFET and reflects the reference voltage reflected in the non-inverting input of the second differential amplifier to the second MOSFET. Thus, the MOSFETs to determine the mirror ratio are biased in substantially same condition, where the third MOSFET may absorb the voltage difference between the reference voltage reflected in the second MOSFET and a voltage caused by the mirror current.

Further complete understanding of the invention may be obtained by reading the following description of specific illustrative embodiments of the invention in conjunction with the appended drawings.

BRIEF DESCRIPTION OF DRAWINGS

FIGS. 5A to 5E each show performances of the optical receiver implementing with the current mirror circuit according to the present embodiment, which has a function of the variable gain and output impedance thereof.

DETAILED DESCRIPTION OF PREFERRED EMBODIMENTS

Next, preferred embodiments of an optical receiver and a current mirror circuit will be described as referring to accompanying drawings. In the description of the drawings, the same numerals or the same symbols will refer to the same elements without overlapping explanations.

Figure 1:
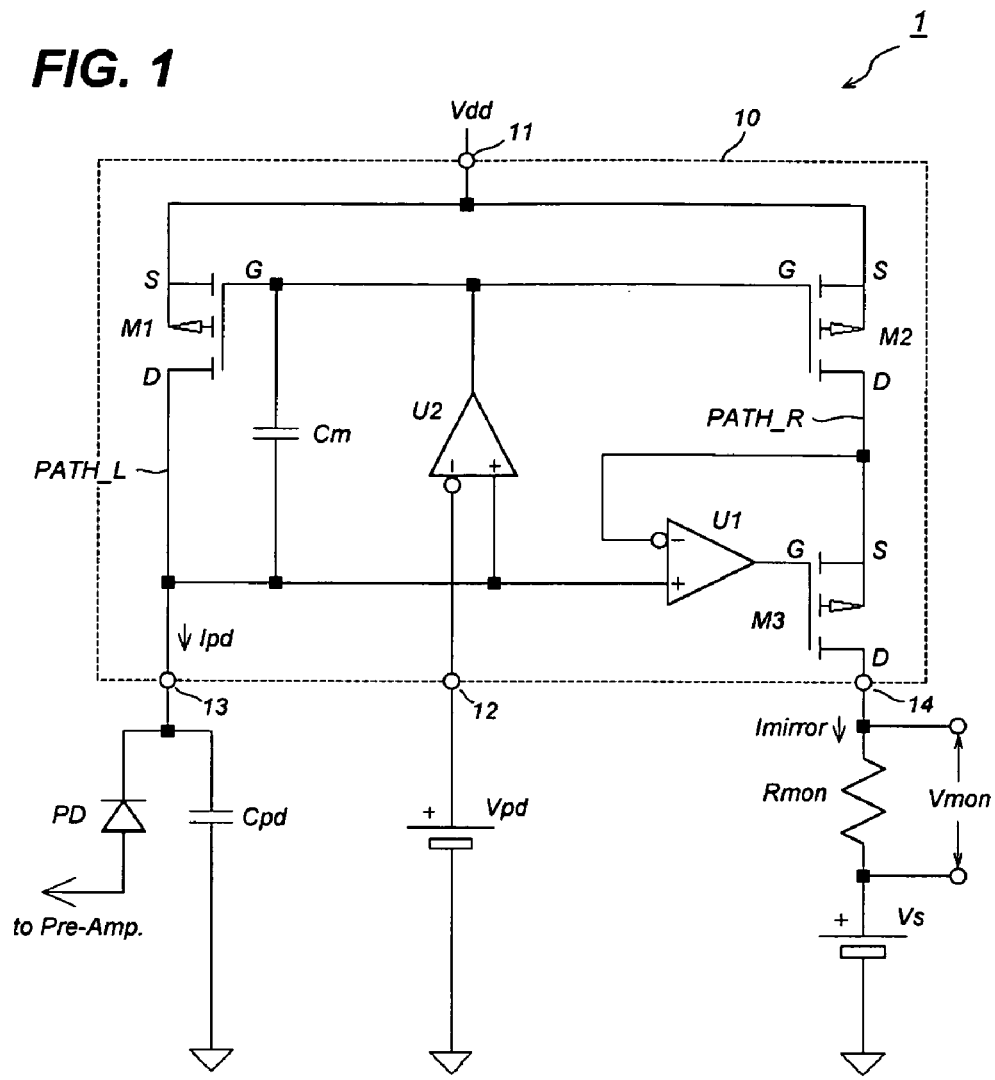
FIG. 1 shows a circuit diagram of the optical receiver according to an embodiment of the present invention.

FIG. 1 is a circuit diagram of the optical receiver according to an embodiment of the present invention. The optical receiver 1, set between the positive power supply Vdd and the ground, includes a current mirror circuit 10, a PD, a reference voltage Vpd, and a sensing resistor Rmon. In the embodiment shown in FIG. 1, the current mirror circuit 10 includes a first current path PATH_L with a first p-MOSFET M1, a second current path PATH_R with a second p-MOSFET M2. These two p-MOSFETs, M1 and M2, operate so as to reflect the current flowing in the first current path PATH_L into a current flowing in the second current path PATH_R. The first current path PATH_L is inserted between the first input terminal 11 and the first output terminal that connects with the PD, while, the second current path PATH_R is inserted between the first input terminal 11 and the second output terminal 14. The current mirror function of the circuit 10 may reflect the photocurrent Ipd generated by the PD into the mirror current Imirror flowing in the second current path PATH_R. The mirror current Imirror causes a voltage difference Vmon in the sensing resistor Rmon, which is connected with the second output terminal 14, and the optical receiver 1 may detect the photocurrent Ipd in the average thereof through the voltage difference Vmon by the sensing resistor Rmon as a voltage signal to be processed in the receiver circuit 1.

The current mirror circuit 10 further includes two differential amplifiers, U1 and U2, and a third p-MOSFET N3. The gates of two p-MOSFETs, M1 and M2, are directly connected to each other and are commonly driven by the output of the second differential amplifier U2, while, the sources thereof are connected with the first input terminal 11 and directly biased by the power supply Vdd. The drain of the first p-MOSFET M1 is coupled with the reversely biased PD connected with the first input terminal 13 to provide the photocurrent Ipd generated in the PD. The drain of the first p-MOSFET M1 is also coupled with the non-inverting input of respective differential amplifiers, U1 and U2. The source of the second p-MOSFET is also directly biased with the positive power supply Vdd through the first input terminal 11, while, the drain thereof is coupled with the third p-MOSFET M3. The gate of the third p-MOSFET M3 is driven by the output of the first amplifier U1, and the drain thereof is coupled with the other reference voltage Vs through the sensing resistor Rmon.

The inverting input of the first amplifier U1 is connected with the source of the third p-MOSFET N3. Accordingly, the first amplifier U1 and the third p-MOSFET M3 constitute a full feedback circuit. Assuming the voltage gain of the first amplifier U1 to be large enough, the source of the third p-MOSFET M3 is virtual short circuit to the inverting input of the first amplifier U1. Thus, the third p-MOSFET operates as a buffer to absorb the difference between the reference voltage Vpd reflected in the drain of the second p-MOSFET and the voltage signal Vmon caused in the sensing resistor Rmon with the second reference Vs. Moreover, the non-inverting input of the second amplifier U2 receives the reference voltage Vpd through the second input terminal 12. Assuming the voltage gain of the second amplifier U2 to be large enough, the inverting input and the non-inverting input of the second amplifier U2 is virtual short circuit by the feedback loop of the second amplifier U2 and the first p-MOSFET M1.

Thus, two virtual short-circuits of the first and second amplifiers, U1 and U2, the drain of the first p-MOSFET M1 in a voltage level thereof coincides with the reference voltage Vpd, and the drain of the second p-MOSFET M2 also coincides with the reference voltage Vpd. Because the gates of the MOSFETs are connected to each other and the sources thereof are directly connected with the power supply Vdd, the bias conditions for these two MOSFETS, M1 and M2, completely coincide with each other independent of the current flowing in the first p-MOSFET M1. Further, the reverse bias condition of the PD may be maintained as the reference voltage Vpd independent of the photocurrent Ipd by the virtual short circuit of two inputs of the second amplifier U2.

The current mirror circuit 10 according to the present embodiment illustrated in FIG. 1, even the power supply Vdd is lowered by the continuous request to reduce the power consumption of the electronic components, may keep the reverse bias condition for the PD in a value determined by the reference voltage Vpd. For instance, setting the positive power supply Vdd to be 2.8 V and the reverse bias voltage for the PD to be 2.5 V, which leaves only 0.3 V for the bias voltage between the source and the drain of the first p-MOSFET M1, the current mirror circuit 10 may keep the bias conditions for respective p-MOSFETS, M1 and M2, completely equal to each other, which realizes a superior current-mirror performance.

Next, the feedback loop formed by the first p-MOSFET M1 and the second amplifier U2 will be described, in particular, the frequency response of the closed loop thereof will be described.

The feedback loop of the p-MOSFET M1 and the amplifier U2 has a plurality of poles that determine the frequency response of the loop. The first pole is formed by a CR filter circuit of a bypassing capacitor Cpd, which is connected between the cathode of the PD and the ground to eliminate noises involved in the bias voltage, and an equivalent resistor Rds between the source and the drain of the first p-MOSFET M1. First consider a case when the optical input power increases and the PD generates a large photocurrent Ipd. The photocurrent flows in the p-MOSFET M1. As already described, because the feedback loop operates so as to keep the cathode bias of the PD constant independent of the photocurrent Ipd, the voltage difference between the source and the drain of the p-MOSFET M1 is also kept constant. Therefore, the equivalent resistor Rds of the p-MOSFET M1 is necessary to become small under such a condition of the large optical input power, or the large photocurrent Ipd.

Conversely, because the photocurrent Ipd decreases when the optical input power is small, the equivalent resistor Rds is necessary to increase. Thus, the photocurrent Ipd varies from a few micro-amperes (μA) to a few milli-amperes (mA); consequently, the equivalent resistor Rds of the p-MOSFET M1 also varies in a range of several digits or more.

The pole frequency $f_{p1}$ of this first pole is in proportion to the inverse of the CR product: $f_{p1} \sim 1/Cpd/Rds/$. Generally, larger capacitance is preferable for the bypassing capacitor. For instance, assuming the bypassing capacitor Cpd has the capacitance of about 200 pF, the pole frequency $f_{p1}$ ranges from several tens to several mega hertz (Hz).

The feedback loop further provides a capacitor Cm connected between the gate and the drain of the p-MOSFET M1. Because the p-MOSFET M1 may be regarded as one type of an inverting amplifier and the capacitor M1 is connected between the input and the output of this inverting amplifier, the capacitance thereof viewed from the output of the amplifier U2 is multiplied by the gain of the inverting amplifier M1, exactly, multiplied by the gain plus unity, which is generally called as the miller capacitor or the miller effect. This miller capacitor Cm makes another pole combined with the output impedance Zout of the amplifier U2 in the feedback loop. The pole frequency $f_{p2}$ attributed to this miller capacitor Cm is in proportion to the inverse of the product: $\{(1+A2)*Cm*Zout\}^{-1}$.

Figure 2A:
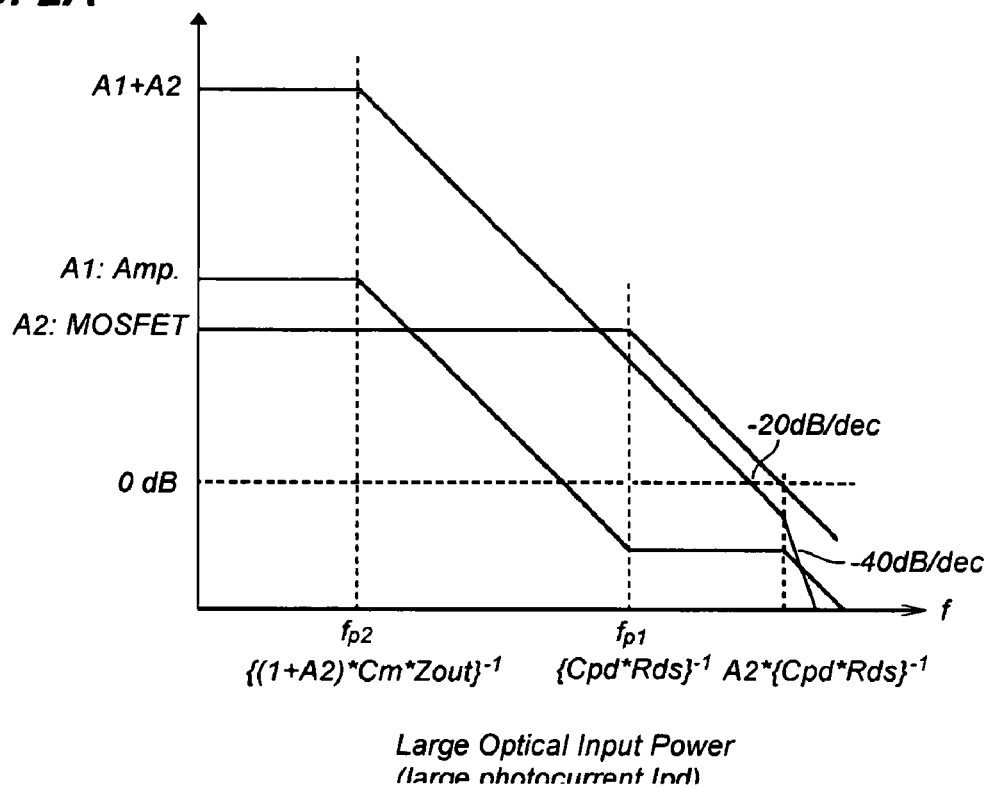
FIG. 2A schematically illustrates frequency response of the feedback loop formed by the differential amplifier and a MOSFET when the photocurrent is relatively large.
Figure 2B:
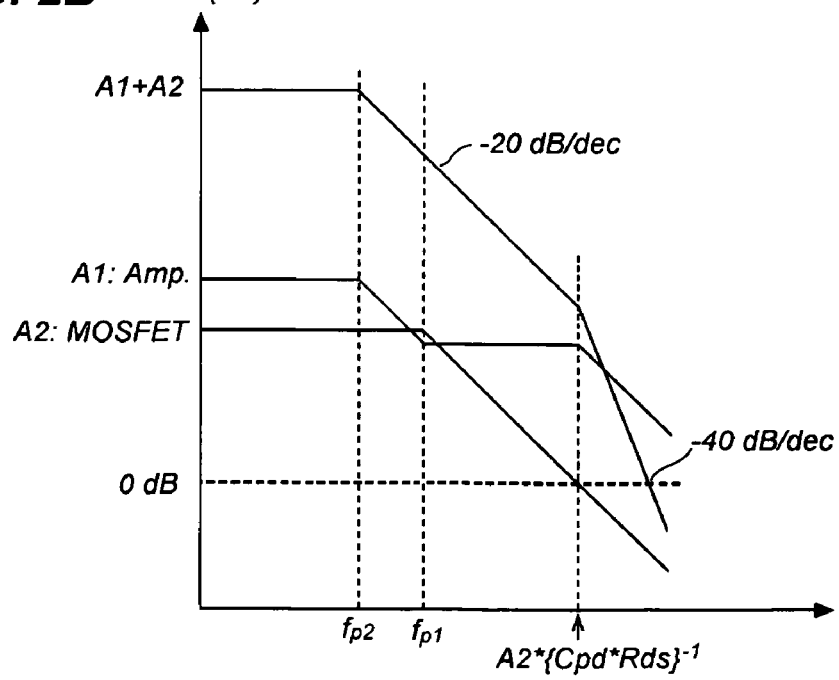
FIG. 2B is frequency response of the feedback loop when the photocurrent is relatively small, in which the differential amplifier provides no function of variable gain and output impedance.

FIGS. 2A and 2B schematically show the frequency response of the feedback loop as assuming that the gains of the amplifier U2 and the MOSFET are A1 and A2, respectively. FIG. 2A corresponds to a case when the optical input power is large, where the large photocurrent Ipd flows in the MOSFET M1 and the equivalent resistor Rds of the MOSFET M1 is small, while, FIG. 2B illustrates a case when the optical input power is small and the equivalent resistor Rds of the MOSFET M1 is large.

The amplifier U2 shows a flat gain A1 (dB) in the low frequency region. Because the miller capacitor Cm is connected as the load of the amplifier U2, the gain characteristic of the amplifier U2 begins to decrease at the pole frequency $f_{p2}$: $\{(1+A2)*Cm*Zout\}^{-1}$ by the slope of −20 dB/dec. On the other hand, the MOSFET M1 has a flat gain of A2 (dB) at low frequencies and begins to decrease at the first pole frequency $f_{p1}$ attributed to the bypassing capacitor, $\{Cpd*Rds\}^{-1}$ by the slope of −20 dB/dec. Because the equivalent resistor Rds of the MOSFET M1 is small, the first pole frequency $f_{p1}$: $\{Cpd*Rds\}^{-1}$ locates in a relatively higher frequency.

Moreover, because the gain of the MOSFET M1 begins to decrease at this pole frequency $f_{p1}$, which consequently decreases the miller capacitor Cm, the gain of the amplifier U2 shows an even characteristic in a region higher than the first pole frequency $f_{p1}$. In a region higher than a frequency, $A2*\{Cpd*Rds\}^{-1}$, which is given by the intersection of a line extending the gain characteristic of the MOSFET M1 by the slope of −20 dB/dec with the horizontal line of the unity gain (0 dB), the MOSFET M1 makes no effect in the miller capacitor Cm, the gain of the amplifier U2 again decreases by the slope of −20 dB/dec. Thus, the total gain of the feedback loop becomes those shown in FIG. 2A.

The most important point is that the slope of the total gain has the value of −20 dB/dec at the frequency where the total gain becomes 0 dB. That is, the phase advance or delay within in the feedback loop may be limited within a range where the loop of the MOSFET M1 and the amplifier U2 may operate stably.

FIG. 2B shows a frequency response of the feedback loop where the optical input power is small and the equivalent resistor Rds becomes large. The amplifier U2 has a flat gain characteristic at low frequencies similar to the case shown in FIG. 2A. The gain of the MOSFET M1, also similar to FIG. 2A, decreases at the frequency of $\{(1+A2)*Cm*Zout\}^{-1}$ by the slope of −20 dB/dec.

However, in the case of FIG. 2B, the first pole frequency $f_{p1}$: $\{Cpd*Rds\}^{-1}$ shifts toward the lower frequency due the increase of the equivalent resistor Rds so as to be close to the pole frequency $f_{p2}$: $\{(1+A2)*Cm*Zout\}^{-1}$ of the second pole attributed to the miller capacitor Cm. As a result of this shift, the flattening of the gain of the amplifier U2 begins at the frequency $f_{p1}$ lower than that shown in FIG. 2A and a loop gain greater than unity is substantially left at the frequency $A2*\{Cpd*Rds\}^{-1}$ where the gain of the MOSFET M1 becomes unity (0 dB). The total gain of the feedback loop decreases with a slope of −40 dB/dec at the frequency where the total gain becomes 0 dB. Under such a condition, the feedback loop in the operation thereof becomes unstable, or the loop occasionally self-oscillates.

Figure 3:
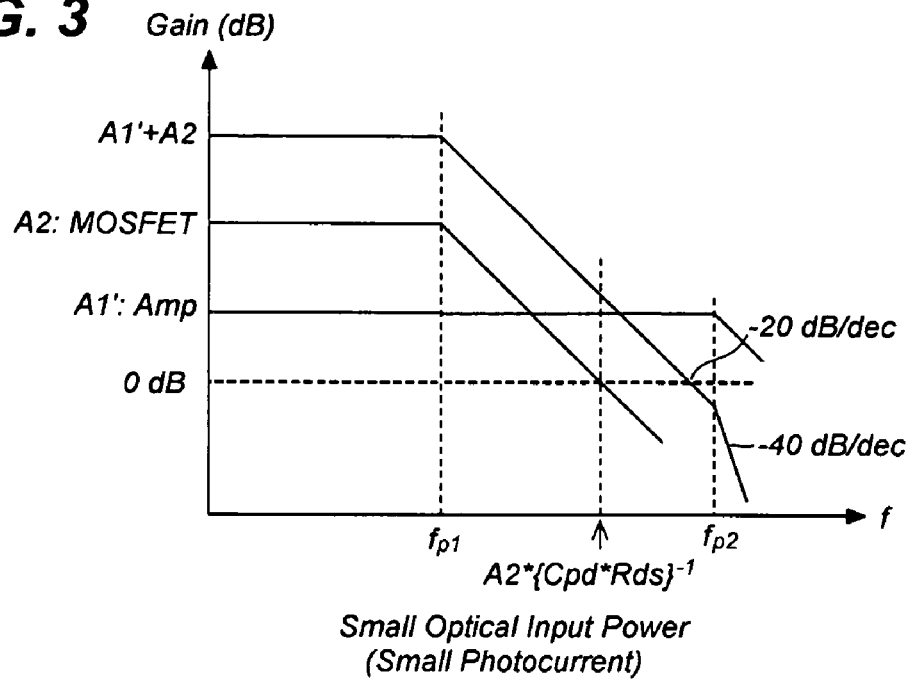
FIG. 3 is frequency response of the feedback loop for the small photocurrent, in which the differential amplifier provides the function of variable gain and output impedance.

In order to solve the subject above described, the current mirror circuit 10 of the present embodiment provides a function to adjust the gain A1 of the amplifier U2 and the output impedance Zout thereof. FIG. 3 schematically illustrates a frequency response of the feedback loop with the function to vary the output impedance Zout and the gain A1. The operation of the MOSFET M1 is the substantially same as those shown in FIG. 2B. However, the amplifier U2 decreases the gain thereof from A1 to A1' and the output impedance from Zout to Zout'. As a result of this decrement, the pole frequency $f_{p2}$ of the miller capacitor shifts to enough higher frequency $\{(1+A2)*Cm*Zout'\}^{-1}$, preferably far greater than the first pole frequency $f_{p1}$.

The total gain of the feedback loop decreases to A1'+A2 (dB) at the low frequencies, begins to decrease at the first pole frequency $f_{p1}$: $\{Cpd*Rds\}^{-1}$, where the gain of the amplifier U2 is kept substantially constant, and the total gain begins to decrease by the slope of −20 dB/dec. This behavior is kept to the second pole frequency $f_{p2}$: $\{(1+A2)*Cm*Zout'\}^{-1}$. The important factor is that the behavior of the slope −20 dB/dec is kept at the frequency where the total gain A1'+A2 becomes 0 dB in FIG. 3, which means that the feedback loop of the MOSFET M1 and the amplifier U2 may satisfy the stable operating condition.

Next, the variable impedance function of the amplifier U2 will be described as referring to FIG. 3. FIG. 3 schematically illustrates a circuit diagram of the amplifier U2. The amplifier U2 provides a differential amplifier unit U21 including a pair of n-MOSFETS, M11 and M12, and a pair of load MOS-FETS, M13 and M14. The gates of respective MOSFETs, VinP and VinN, correspond to the non-inverting input and the inverting input of the differential amplifier U2. One of the paired MOSFETs M12 provides the output OUT of the amplifier U2. The amplifier U2 further provides a impedance variable unit U22 that includes a pair of p-MOSFETs, M15 and M16, each source being connected with the drain through a resistor, R1 or R2, a control MOSFET M17 that determines the gate bias of the paired MOSFETs, M15 and M16, and a control resistor R13.

When the optical input power becomes small, the current mirror circuit 1 sets the equivalent resistor Rds of the MOSFET M1 large. That is, the current mirror circuit 1 increases the gate level of the MOSFET M1, which means that the bias between the gate and the source of the MOSFET M1 becomes small. Increasing the output level of the amplifier U2, the bias between the gate and the source of the MOSFET M17 within the amplifier U2 also becomes small, which reduces the drain current flowing out from the MOSFET 17 and makes the voltage drop at the control resistor R13, which lowers the gate level of the paired MOSFETs, M15 and M16.

Lowering the gate level of the paired MOSFETs, M15 and M16, means that the gate bias between the gate and the source thereof expands, which increases the shunted drain current for the MOSFETS, M15 and M16. Accordingly, not only the load becomes small viewed from the drain of the paired MOSFETS, M11 and M12, which means the gain of the amplifier unit U21 also becomes small but the output impedance viewed from the output OUT decreases. Thus, the impedance lowering and the gain reduction at the small optical input power may be realized.

Figure 4:
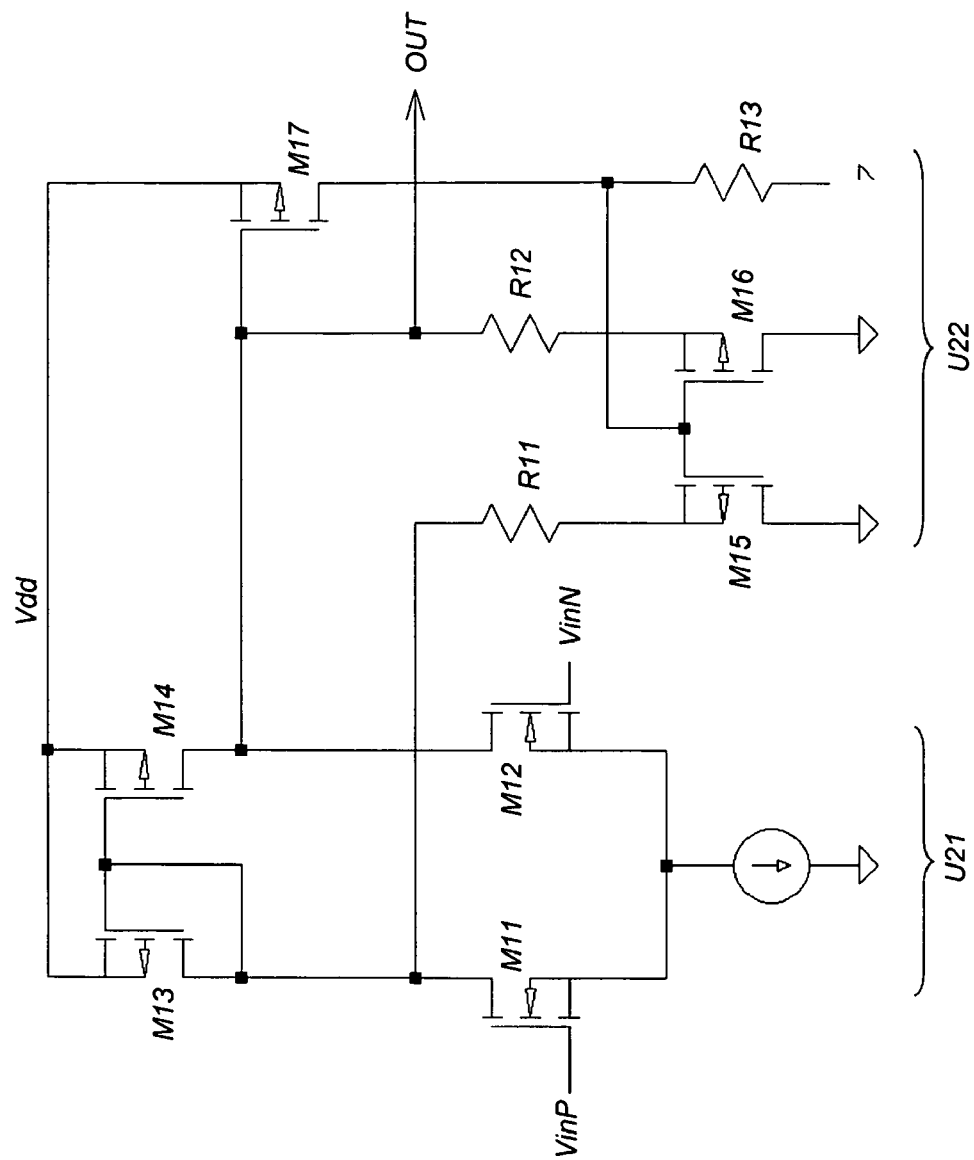
FIG. 4 is a circuit diagram of the differential amplifier.

FIGS. 4A to 4E shows characteristics of the current mirror circuit according to the embodiment of the invention. The horizontal axis is the optical input power by the unit of dB, which corresponds to the magnitude of the photocurrent Ipd. The mirror ratio shown in FIG. 4A is a ratio of the current flowing in the first current path PATH_L, which is the photocurrent, to the second current flowing in the second path PATH_R, which is the sensed current. Because the embodiment above described implements two MOSFETs, M1 and M2, with the same size to each other; accordingly, the mirror ratio ideally becomes unity.

Because of the variable output impedance and the variable gain of the amplifier U2, the mirror ratio runs off from unity. However, the shift of the mirror ration from unity is within 0.5%, which is an acceptable scope. Other four characteristics, the phase difference around the feedback loop of the amplifier U2 and the MOSFET M1, the zero frequency where the loop gain becomes unity, the DC loop gain, and the bias voltage directly applied to the PD, reflect the variable gain and output impedance characteristic of the amplifier U2 with a threshold of optical input power of −8 dBm. However, even the gain of the amplifier U2 and the output impedance Zout thereof variably decreases, the bias voltage directly applied to the PD only varies less than 3%.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. An optical receiver comprising:
   a photodiode for generating a photocurrent by receiving an optical signal;
   a power supply;
   a sensing resistor; and
   a current mirror circuit connected between said photodiode and said power supply, said current mirror circuit including,
   a first input terminal connected with said power supply,
   a first output terminal connected with said photodiode,
   a second output terminal connected with said sensing resistor,
   a first current path inserted between said first input terminal and said first output terminal, said first current path implementing with a first transistor for providing said photocurrent in said first output terminal,
   a second input terminal for receiving a reference voltage that is directly reflected in said first output to bias said photodiode reversely, and
   a second current path inserted between said first input terminal and said second output terminal, said second current path implementing with a second transistor for providing a mirror current that mirrors said photocurrent in said second output terminal, said sensing resistor converting said mirror current into a voltage signal to be output from said optical receiver;
   first and second differential amplifiers,
   said second differential amplifier commonly driving said first and second transistors and reflecting said reference voltage in said first output by a virtual short circuit between inverting and non-inverting inputs of said second differential amplifier, and
   said first differential amplifier reflecting said reference voltage reflected in said first output to a current terminal of said second transistor by a virtual short circuit between inverting and non-inverting inputs of said first differential amplifier,
   wherein said first transistor and said second transistor are biased in a same condition.

2. The optical receiver according to claim 1,
   further comprising a third transistor connected between said current terminal of said second transistor and said second output, said third transistor absorbing a voltage difference between said reference voltage reflected in said current terminal of said second transistor and said voltage signal formed by said sensing resistor.

3. The optical receiver according to claim 1,
   wherein said first transistor provides a miller capacitor connected between a control terminal of said first transistor and said first output.

4. The optical receiver according to claim 1,
   wherein said second amplifier varies a gain and an output impedance thereof as varying a magnitude of said optical signal.

5. The optical receiver according to claim 4,
   wherein said second amplifier decreases said gain and said output impedance thereof when said photocurrent is smaller than a predetermined current.

6. The optical receiver according to claim 5,
   wherein said predetermined current corresponds to said optical signal whose magnitude is −8 dBm.

7. The optical receiver according to claim 4,
wherein said second differential amplifier comprises an amplifier unit biased by said power supply and an impedance variable unit,
wherein said amplifier unit provides a pair of transistors whose control terminals are connected with said inverting and non-inverting inputs of said second differential amplifier, respectively, and
wherein said impedance variable unit is driven by said amplifier unit so as to shunt a current provided from said power supply to said amplifier unit.

8. The optical receiver according to claim 1,
further comprising a bypassing capacitor connected in parallel with said photodiode,
wherein said first transistor provides a miller capacitor connected between a control terminal of said first transistor and said first output, and said second amplifier varies a gain and an output impedance thereof, and
wherein said first transistor and said second differential amplifier constitute a feedback loop with a first pole formed by said bypassing capacitor and an equivalent resistance of said first transistor, and a second pole formed by said miller capacitor and said output impedance of said second differential amplifier,
wherein said feedback loop has a slope of −20 dB/dec for a total gain thereof at a frequency where said total gain is 0 dB.

9. The optical receiver according to claim 8,
wherein said first to third transistors are MOSFETs and said first and second differential amplifiers are operational amplifiers formed by MOSFETS.

10. A current mirror circuit
providing a first input terminal connected with a power supply, and first and second output terminals, said current mirror circuit comprising:
a first current path inserted between said first input terminal and said first output terminal, said first current path providing a first MOSFET to provide a first current in said first output terminal,
a second current path inserted between said first input terminal and said second output terminal, said second current path providing a second MOSFET to provide a second current in said second output terminal,
first and second differential amplifiers,
a third MOSFET connected between said second MOSFET and said second output terminal, and
a second input terminal to receive a reference voltage,
said first MOSFET and said second MOSFET being connected with said first input terminal in respective sources thereof and being commonly driven by an output of said second differential amplifier,
said second differential amplifier reflecting said reference voltage in said first output terminal by a virtual short circuit between an inverting input and a non-inverting input of said second differential amplifier, and said first differential amplifier reflecting said reference voltage reflected in said first output terminal in a drain of said second MOSFET by a virtual short circuit between an inverting input and a non-inverting input of said first differential amplifier,
said third MOSFET being driven by an output of said first differential amplifier so as to absorb a difference between said reference voltage and a voltage appearing in said second output terminal,
wherein said first MOSFET and said second MOSFET are biased in a same condition and said second current appearing in said second output terminal mirrors said first current.

11. The current mirror circuit according to claim 10,
further comprising a capacitor connected between a gate and a drain of said first MOSFET,
wherein said second differential amplifier varies a gain and an output impedance thereof,
wherein said second differential amplifier and said first MOSFET constitute a feedback loop with a pole formed by said capacitor and an output impedance of said second differential amplifier.

12. The current mirror circuit according to claim 11,
wherein said second differential amplifier decreases said gain and said output impedance only when a current flowing in said first MOSFET is smaller than a predetermined current.

13. The current mirror circuit according to claim 11,
wherein said second differential amplifier comprises an amplifier unit and an impedance variable unit driven by said amplifier unit,
wherein said impedance variable unit shunts a current supplied to said amplifier unit so as to decrease said gain and said output impedance of said second differential amplifier.

* * * * *